United States Patent
Wei et al.

(10) Patent No.: US 8,759,130 B2
(45) Date of Patent: Jun. 24, 2014

(54) METHOD FOR MAKING LIGHT EMITTING DIODE

(71) Applicants: Tsinghua University, Beijing (CN); Hon Hai Precision Industry Co., Ltd., New Taipei (TW)

(72) Inventors: Yang Wei, Beijing (CN); Shou-Shan Fan, Beijing (CN)

(73) Assignees: Tsinghua University, Bejing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/729,268

(22) Filed: Dec. 28, 2012

(65) Prior Publication Data
US 2013/0260502 A1    Oct. 3, 2013

(51) Int. Cl.
*H01L 21/00* (2006.01)

(52) U.S. Cl.
USPC ............................. 438/29; 438/47

(58) Field of Classification Search
CPC ............. H01L 33/007; H01L 33/0062; H01L 33/0075; H01L 33/0079
See application file for complete search history.

(56) References Cited

U.S. PATENT DOCUMENTS

| | | | | |
|---|---|---|---|---|
| 8,440,485 B2 * | 5/2013 | Wei et al. | ........ | 438/42 |
| 8,497,144 B1 * | 7/2013 | Tsang | ........ | 438/22 |
| 2007/0275487 A1 * | 11/2007 | Lee | ........ | 438/22 |
| 2011/0101302 A1 * | 5/2011 | Zhou et al. | ........ | 257/13 |
| 2012/0276673 A1 * | 11/2012 | Wei et al. | ........ | 438/42 |
| 2013/0143342 A1 * | 6/2013 | Zhu et al. | ........ | 438/29 |

* cited by examiner

*Primary Examiner* — Richard Booth
(74) *Attorney, Agent, or Firm* — Novak Druce Connolly Bove + Quigg LLP (57) ABSTRACT

A method for making a light emitting diode includes the following steps. A substrate having a first epitaxial growth surface is provided. A carbon nanotube layer is placed on the first epitaxial growth surface of the substrate. A surface of the first semiconductor layer is exposed by removing the substrate and the carbon nanotube layer. The surface of the first semiconductor layer is defined as a second epitaxial growth surface. An active layer and a second semiconductor layer are grown on the second epitaxial growth surface in that order. A surface of the active layer contacted the first semiconductor layer engages with the second epitaxial growth surface. A part of the first semiconductor layer is exposed by etching a part of the active layer and the second semiconductor layer. A first electrode is applied on the first semiconductor layer and a second electrode is applied on the second semiconductor layer.

15 Claims, 10 Drawing Sheets

METHOD FOR MAKING LIGHT EMITTING DIODE

CROSS-REFERENCE TO RELATED APPLICATIONS

This application claims all benefits accruing under 35 U.S.C. §119 from China Patent Application No. 201210085255.3 filed on Mar. 28, 2012 in the China Intellectual Property Office, disclosure of which is incorporated herein by reference. This application is related to applications entitled, "METHOD FOR MAKING EPITAXIAL STRUCTURE", filed Aug. 24, 2012 Ser. No. 13/593,602; "METHOD FOR MAKING EPITAXIAL STRUCTURE", filed Aug. 24, 2012 Ser. No. 13/593,607; "METHOD FOR MAKING LIGHT EMITTING DIODE", filed Dec. 28, 2012 Ser. No. 13/729,224; "METHOD FOR MAKING EPITAXIAL BASE", filed Oct. 9, 2012 Ser. No. 13/647,443; "EPITAXIAL BASE", filed Oct. 9, 2012 Ser. No. 13/647,444; "EPITAXIAL STRUCTURE", filed Oct. 9, 2012 Ser. No. 13/647,445.

BACKGROUND

1. Technical Field

The present disclosure relates to a light emitting diode (LED) and a method for making the same.

2. Description of Related Art

LEDs are semiconductors that convert electrical energy into light. Compared to conventional light sources, LEDs have higher energy conversion efficiency, higher radiance (i.e., they emit a larger quantity of light per unit area), longer lifetime, higher response speed, and better reliability. At the same time, LEDs generate less heat. Therefore, LED modules are widely used as light sources in optical imaging systems, such as displays, projectors, and so on.

A conventional method of making the LEDs method includes the following steps. A buffer layer, a first semiconductor layer, an active layer and a second semiconductor layer are deposited on a substrate by a metal organic chemical vapor deposition (MOCVD) method. The second semiconductor layer and the active layer are etched via inductance-coupling plasma etch process, thereby exposing a surface of the first semiconductor layer. A first electrode is deposited on a top surface of the first semiconductor layer via electron beam evaporation process. A second electrode is formed on the second semiconductor layer via electron beam evaporation process. In order to improve the light extraction efficiency of the LEDs, the second semiconductor is etched via inductance-coupling plasma etch process to roughen a top surface. The roughened top surface is used as the light extraction surface. However, in the above method, etching the light extraction surface to roughen the top surface thereof, is a complex manufacturing process and has a high manufacturing cost. Furthermore, during the etching process, the lattice structure of the semiconductor layer may be destroyed.

What is needed, therefore, is a light emitting diode that can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present epitaxial structures and methods for making the same.

Figure 1:
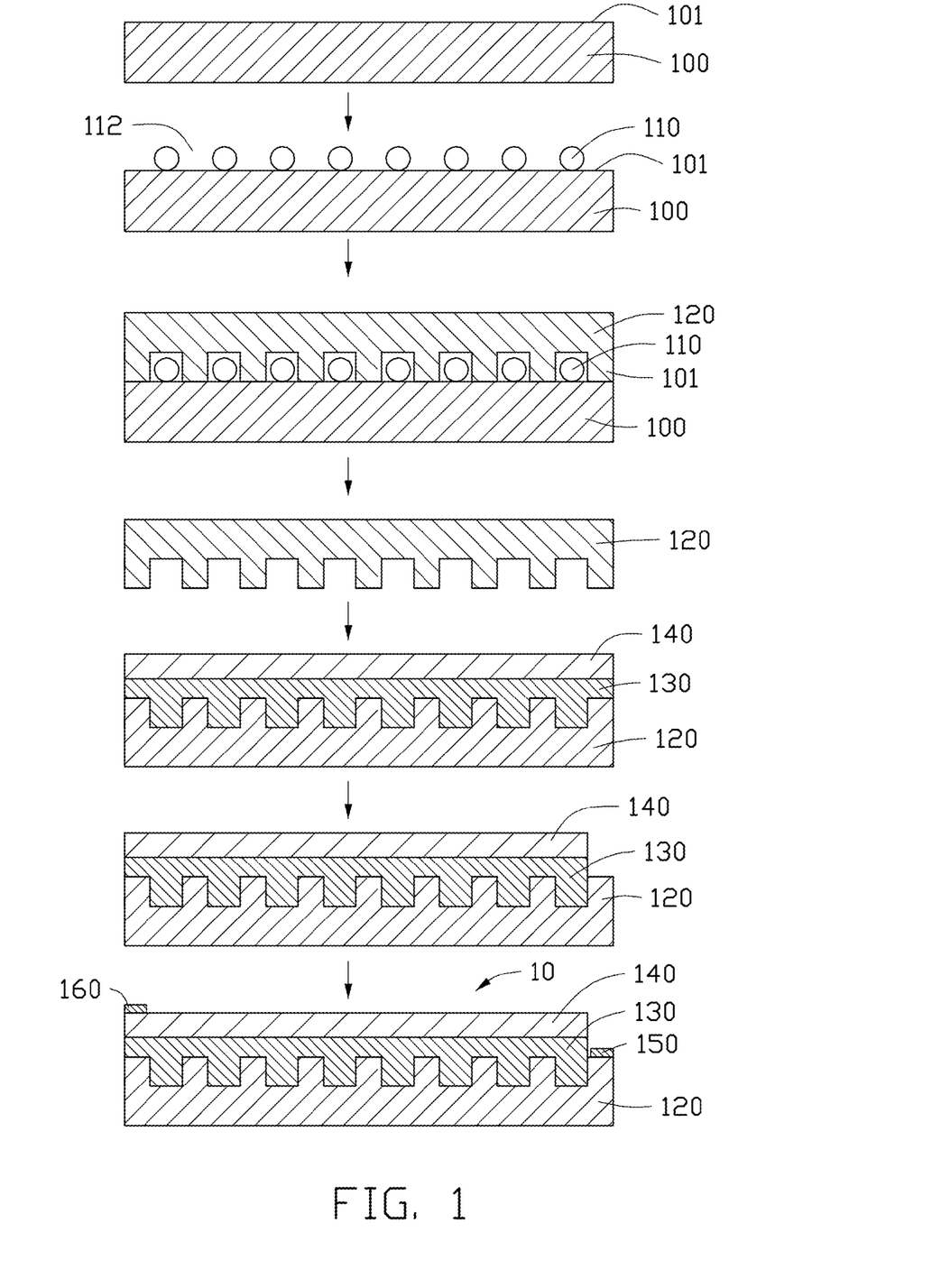
FIG. 1 is a flowchart of one embodiment of a method for making an LED.

Referring to FIG. 1, a method for making a light emitting diode (LED) 10 of one embodiment includes the following steps:

step (11), providing a substrate 100 having a first epitaxial growth surface 101;

step (12), placing a carbon nanotube layer 110 on the first epitaxial growth surface 101 of the substrate 100;

step (13), epitaxially growing a first semiconductor layer 120 on the first epitaxial growth surface 101 of the substrate 100;

step (14), exposing a surface of the first semiconductor layer 120 by removing the substrate 100 and the carbon nanotube layer 110, wherein the surface of the first semiconductor layer 120 is defined as a second epitaxial growth surface;

step (15), growing an active layer 130 and a second semiconductor layer 140 on the second epitaxial growth surface in that order, wherein a surface of the active layer 130 contacting the first semiconductor layer 120 engages with the second epitaxial growth surface;

step (16), exposing a part of the first semiconductor layer 120 by etching a part of the active layer 130 and the second semiconductor layer 140; and step (17), applying a first electrode 150 on the first semiconductor layer 120 and applying a second electrode 160 on the second semiconductor layer 140.

In step (11), the first epitaxial growth surface 101 can be used to grow the first semiconductor layer 120. The first epitaxial growth surface 101 is a clean and smooth surface. The substrate 100 can be a single-layer structure or a multi-layer structure. If the substrate 100 is a single-layer structure, the substrate 100 can be a single crystal structure having a crystal face used as the first epitaxial growth surface 101. The material of the substrate 100 can be SOI (Silicon on insulator), LiGaO$_2$, LiAlO$_2$, Al$_2$O$_3$, Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn or GaP:N. If the substrate 100 is a multi-layer structure, the substrate 100 should include at least one layer having the crystal face. The material of the substrate 100 can be selected according to the material of the first semiconductor layer 120. The first semiconductor layer 120 and the substrate 100 should have a small lattice mismatch and a thermal expansion mismatch. The size, thickness, and shape of the substrate 100 can be selected according to need. In one embodiment, the substrate 100 is a sapphire substrate.

In step (12), the carbon nanotube layer 110 is located on the first epitaxial growth surface 101. The carbon nanotube layer 110 and the first epitaxial growth surface 101 are in contact with each other. The carbon nanotube layer 110 comprises a plurality of carbon nanotubes. The extending direction of the carbon nanotubes is substantially parallel to the surface of the carbon nanotube layer 110 and the first epitaxial growth surface 101.

The thickness of the carbon nanotube layer 110 can be in a range from about 1 nanometer to about 100 micrometers. For example, the thickness of the carbon nanotube layer 110 can be about 10 nanometers, about 200 nanometers, or about 1 micrometer. In one embodiment, the thickness of the carbon nanotube layer 110 is about 100 nanometers. The carbon nanotube layer 110 forms a pattern. The carbon nanotube layer 110 includes a plurality of carbon nanotubes. The carbon nanotubes on the first epitaxial growth surface 101 can be single-walled, double-walled, or multi-walled carbon nanotubes. The length and diameter of the carbon nanotubes can be selected according to need. A part of the first epitaxial growth surface 101 can be exposed from the patterned carbon nanotube layer 110 after the carbon nanotube layer is placed on the first epitaxial growth surface 101, therefore, the first epitaxial growth surface 101 forms a pattern. Thus, the first semiconductor layer 120 can grow from the exposed epitaxial growth surface 101.

The term "patterned structure" refers to the carbon nanotube layer 110 defining a plurality of apertures 112. The plurality of apertures 112 can be dispersed uniformly. The plurality of apertures 112 extend throughout the first epitaxial growth surface 101 along the thickness direction thereof. Each of the plurality of apertures 112 can be a hole defined by several adjacent carbon nanotubes, or a gap defined by two substantially parallel carbon nanotubes and extending substantially along axial directions of the carbon nanotubes. The plurality of apertures 112 which are hole-shaped and the plurality of apertures 112 which are gap-shaped can exist in the patterned carbon nanotube layer 110 at the same time. Hereafter, the size of each of the plurality of apertures 112 is the diameter of the hole or width of the gap. The sizes of the plurality of apertures 112 can be different. The average size of the plurality of apertures 112 can be in a range from about 10 nanometers to about 300 micrometers. For example, the sizes of the plurality of apertures 112 can be about 10 nanometers, about 1 micrometer, about 10 micrometers, about 80 micrometers, or about 120 micrometers. The smaller the sizes of the plurality of apertures 112, the less dislocation defects will occur during the process of growing the first semiconductor layer 120. In one embodiment, the sizes of the plurality of apertures 112 are in a range from about 10 nanometers to about 10 micrometers. A duty factor of the first epitaxial growth surface 101 is an area ratio between the first epitaxial growth surface 101 which is sheltered by the carbon nanotube layer 110 and the first epitaxial growth surface 101 which is exposed by the plurality of apertures 112. The duty factor of the first epitaxial growth surface 101 can be in a range from about 1:100 to about 100:1. For example, the duty factor of the carbon nanotube layer 110 can be about 1:10, about 1:2, about 1:4, about 4:1, about 2:1, or about 10:1. In one embodiment, the duty factor of the carbon nanotube layer 110 is in a range from about 1:4 to about 4:1.

The carbon nanotubes of the carbon nanotube layer 110 can be orderly arranged to form an ordered carbon nanotube structure or disorderly arranged to form a disordered carbon nanotube structure. The term 'disordered carbon nanotube structure' includes, but is not limited to, a structure wherein the carbon nanotubes are arranged along many different directions, and the aligning directions of the carbon nanotubes are random. The number of the carbon nanotubes arranged along each different direction can be almost the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure wherein the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes of the carbon nanotube layer 110 are arranged to extend along the direction substantially parallel to the surface of the carbon nanotube layer 110 to obtain a pattern having greater light transmission. After placement on the first epitaxial growth surface 101, the carbon nanotubes of the carbon nanotube layer 110 can be arranged to extend along the direction substantially parallel to the first epitaxial growth surface 101. The carbon nanotubes in the ordered carbon nanotube structure can also be arranged to extend along the crystallographic orientation of the substrate 100 or along a direction which forms an angle with the crystallographic orientation of the substrate 100.

The carbon nanotube layer 110 can be formed on the first epitaxial growth surface 101 by chemical vapor deposition (CVD), transfer printing a preformed carbon nanotube film, or filtering and depositing a carbon nanotube suspension. In one embodiment, the carbon nanotube layer 110 is a free-standing structure and can be drawn from a carbon nanotube array. The term "free-standing structure" means that the carbon nanotube layer 110 can sustain the weight of itself when it is hoisted by a portion thereof without any significant damage to its structural integrity. Thus, the carbon nanotube layer 110 can be suspended by two spaced supports. The carbon nanotube layer 110 which is free-standing can be laid on the first epitaxial growth surface 101 directly and easily.

The carbon nanotube layer 110 can be a substantially pure structure of carbon nanotubes, with few impurities and chemical functional groups. The carbon nanotube layer 110 can also be a composite including a carbon nanotube matrix and non-carbon nanotube materials. The non-carbon nanotube materials can be graphite, graphene, silicon carbide, boron nitride, silicon nitride, silicon dioxide, diamond, amorphous carbon, metal carbides, metal oxides, or metal nitrides. The non-carbon nanotube materials can be coated on the carbon nanotubes of the carbon nanotube layer 110. In one embodiment, the non-carbon nanotube materials are coated on the carbon nanotubes of the carbon nanotube layer 110 so that the carbon nanotubes can have greater diameters and the plurality of apertures 112 can be smaller. The non-carbon nanotube materials can be deposited on the carbon nanotubes of the carbon nanotube layer 110 by CVD or physical vapor deposition (PVD), such as sputtering.

Furthermore, the carbon nanotube layer 110 can be treated with an organic solvent after being placed on the first epitaxial growth surface 101 so that the carbon nanotube layer 110 can be attached on the first epitaxial growth surface 101 firmly. Specifically, the organic solvent can be applied to entire surface of the carbon nanotube layer 110 or an entirety of the carbon nanotube layer 110 can be immersed in an organic solvent. The organic solvent can be volatile, such as ethanol, methanol, acetone, dichloroethane, chloroform, or mixtures thereof. In one embodiment, the organic solvent is ethanol.

The carbon nanotube layer 110 can include at least one carbon nanotube film, at least one carbon nanotube wire, or combination thereof. In one embodiment, the carbon nanotube layer 110 can include a single carbon nanotube film or two or more carbon nanotube films stacked together. Thus, the thickness of the carbon nanotube layer 110 can be controlled by the number of the stacked carbon nanotube films. The number of the stacked carbon nanotube films can be in a range from about 2 to about 100. For example, the number of the stacked carbon nanotube films can be 10, 30, or 50. In one embodiment, the carbon nanotube layer 110 can include a layer of substantially parallel and spaced carbon nanotube wires. The carbon nanotube layer 110 can also include a plurality of carbon nanotube wires crossed or weaved together to form a carbon nanotube net. The distance between two adjacent substantially parallel and spaced carbon nanotube wires can be in a range from about 0.1 micrometers to about 200 micrometers. In one embodiment, the distance between two adjacent substantially parallel and spaced carbon nanotube wires is in a range from about 10 micrometers to about 100 micrometers. The gap between two adjacent substantially parallel carbon nanotube wires is defined as one of the plurality of apertures 112. The size of each of the plurality of apertures 112 can be controlled by controlling the distance between two adjacent substantially parallel and spaced carbon nanotube wires. The length of the gap between two adjacent substantially parallel carbon nanotube wires can be equal to the length of the carbon nanotube wire. It is understood that any carbon nanotube structure described can be used with all embodiments.

Figure 2:
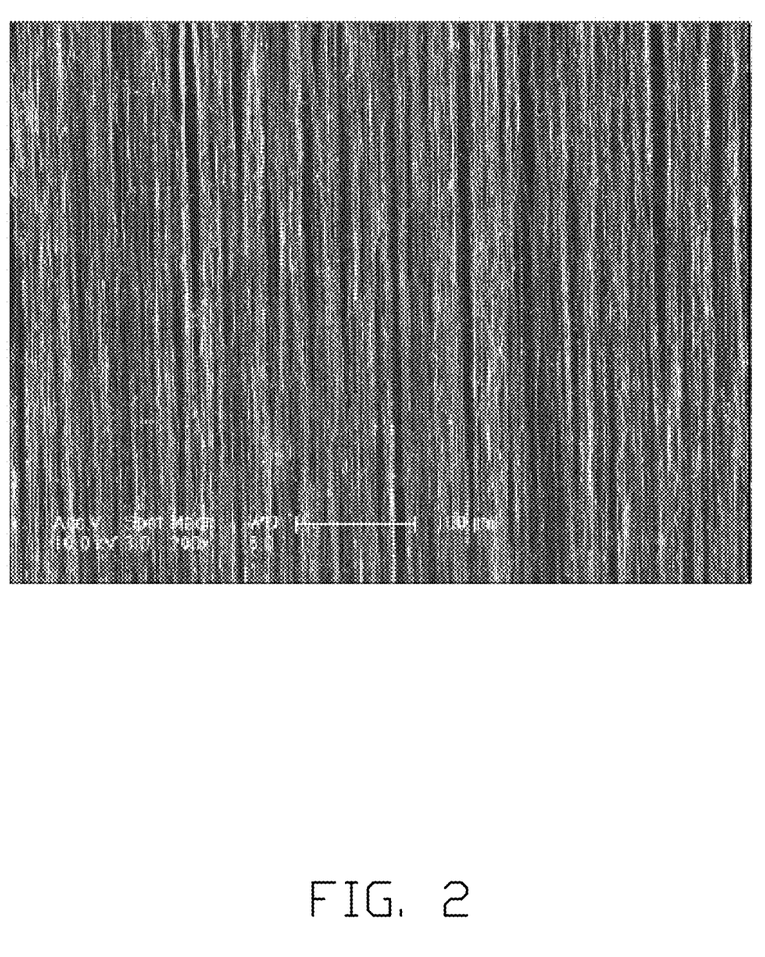
FIG. 2 is a Scanning Electron Microscope (SEM) image of a drawn carbon nanotube film.
Figure 3:
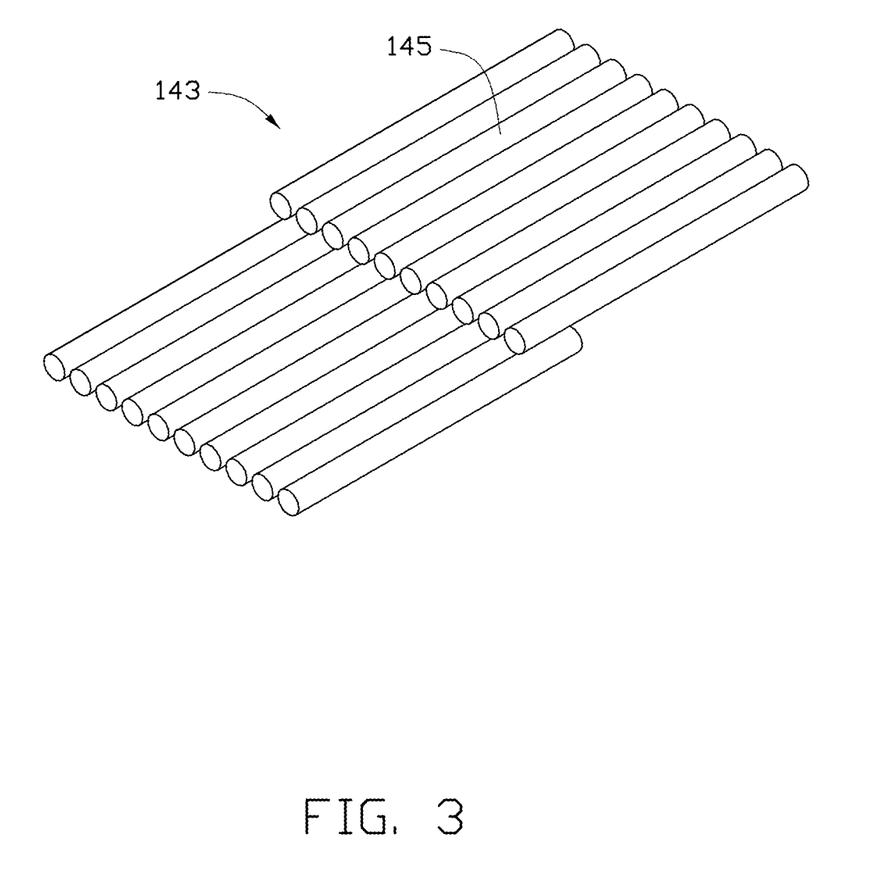
FIG. 3 is a schematic view of one embodiment of a carbon nanotube segment of the drawn carbon nanotube film of FIG. 2.

In one embodiment, the carbon nanotube layer 110 includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIGS. 2 to 3, each of the plurality of carbon nanotube segments 113 includes a plurality of carbon nanotubes 115 similarly oriented at an orientation direction and axially combined by van der Waals attractive force therebetween. Each drawn carbon nanotube film includes a plurality of carbon nanotube segments 113, wherein each of the plurality of carbon nanotube segments is successively oriented along the orientation direction, and wherein an end of one of the plurality of carbon nanotube segments is joined to an end of another one of the plurality of carbon nanotube segments by van der Waals attractive force therebetween. As can be seen in FIG. 2, some variations can occur in the drawn carbon nanotube film. Carbon nanotubes 115 of the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 1 nanometer to about 100 micrometers. The drawn carbon nanotube film can be attached to the first epitaxial growth surface 101 directly.

Figure 4:
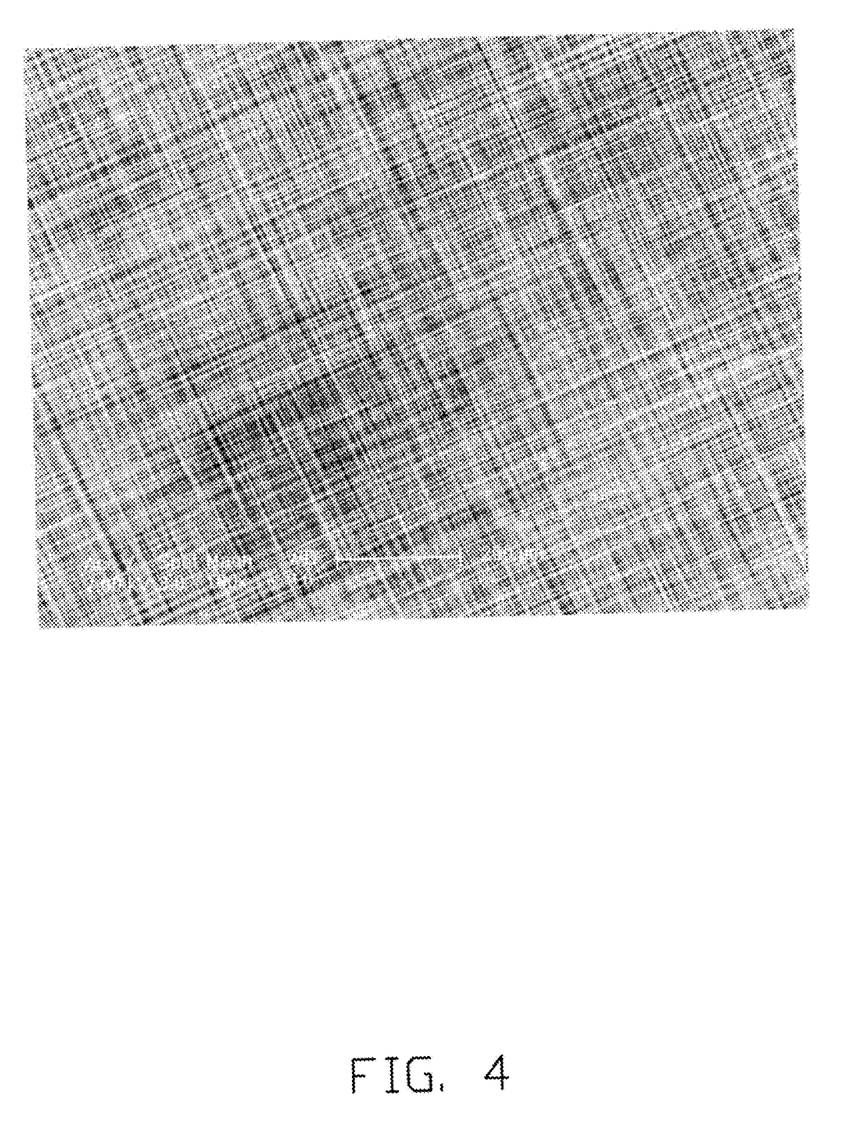
FIG. 4 is an SEM image of one embodiment of a plurality of carbon nanotube films stacked in a cross order.

Referring to FIG. 4, the carbon nanotube layer 110 can include at least two stacked drawn carbon nanotube films. In other embodiments, the carbon nanotube layer 110 can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked drawn carbon nanotube films is larger than 0 degree, a plurality of micropores is defined by the carbon nanotube layer 110. Stacking the carbon nanotube films will also add to the structural integrity of the carbon nanotube layer 110.

A step of heating the drawn carbon nanotube film can be performed to decrease the thickness of the drawn carbon nanotube film. The drawn carbon nanotube film can be partially heated by a laser or microwave. The thickness of the drawn carbon nanotube film can be reduced because some of the carbon nanotubes will be oxidized. In one embodiment, the drawn carbon nanotube film is irradiated by a laser device in an atmosphere comprising of oxygen therein. The power density of the laser is greater than $0.1 \times 10^4$ watts per square meter. The drawn carbon nanotube film can be heated by fixing the drawn carbon nanotube film and moving the laser device at a substantially uniform speed to irradiate the drawn carbon nanotube film. When the laser irradiates the drawn carbon nanotube film, the laser is focused on the surface of the drawn carbon nanotube film to form a laser spot. The diameter of the laser spot ranges from about 1 micron to about 5 millimeters. In one embodiment, the laser device is carbon dioxide laser device, the power of the laser device is about 30 watts, the wavelength of the laser is about 10.6 micrometers, the diameter of the laser spot is about 3 millimeters, the velocity of the laser movement is less than 10 millimeters per second, and the power density of the laser is about $0.053 \times 10^{12}$ watts per square meter.

Figure 5:
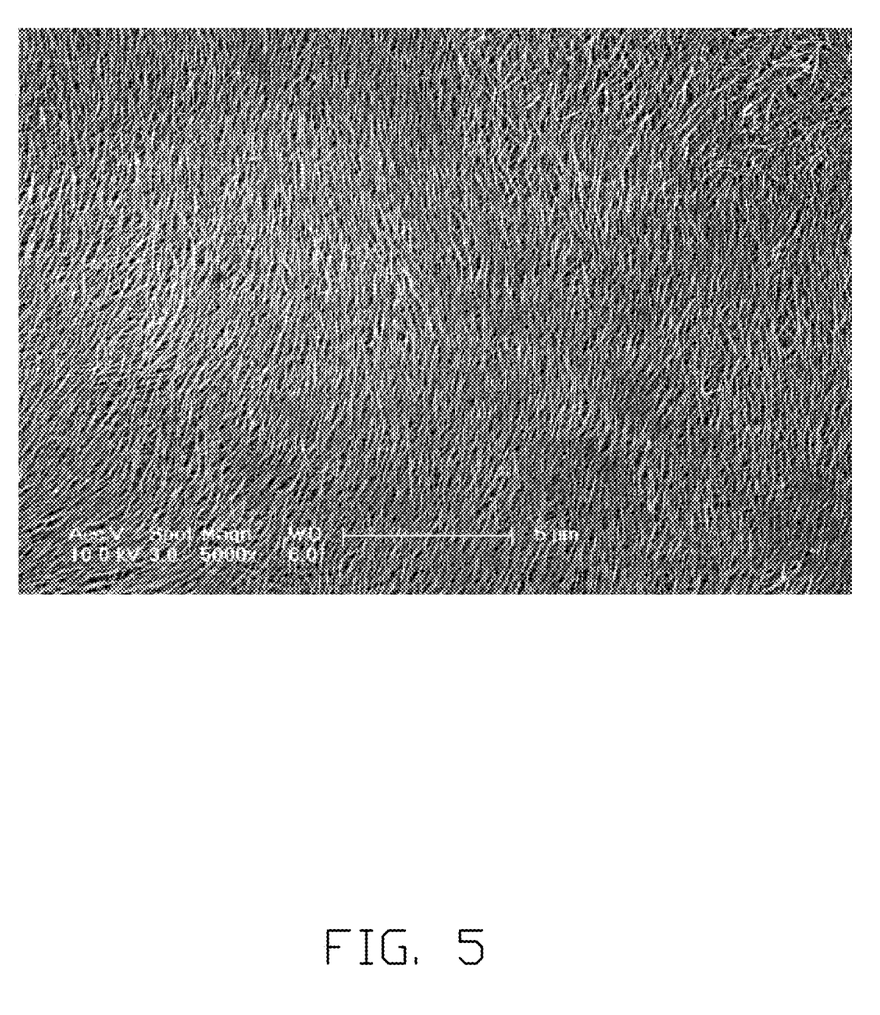
FIG. 5 is an SEM image of one embodiment of a pressed carbon nanotube film.

In another embodiment, the carbon nanotube layer 110 can include a pressed carbon nanotube film. Referring to FIG. 5, the pressed carbon nanotube film can be a free-standing carbon nanotube film. The carbon nanotubes in the pressed carbon nanotube film are arranged along a same direction or arranged along different directions. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is about 0 degree to approximately 15 degrees. The greater the pressure applied, the smaller the angle formed. If the carbon nanotubes in the pressed carbon nanotube film are arranged along different directions, the carbon nanotube layer 110 can be isotropic.

Figure 6:
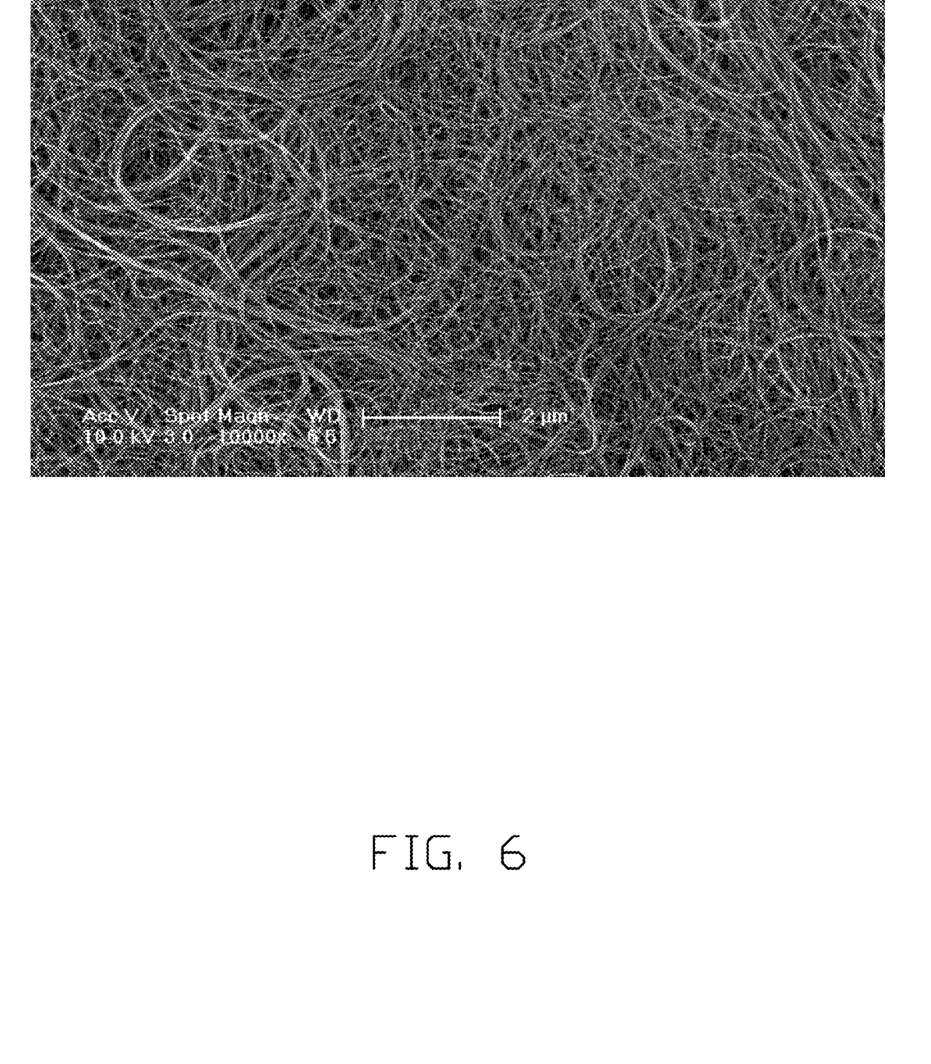
FIG. 6 is an SEM image of one embodiment of a flocculated carbon nanotube film.

In another embodiment, the carbon nanotube layer 110 includes a flocculated carbon nanotube film. Referring to FIG. 6, the flocculated carbon nanotube film can include a plurality of long, curved, disordered carbon nanotubes entangled with each other. Furthermore, the flocculated carbon nanotube film can be isotropic. The carbon nanotubes can be substantially uniformly dispersed in the carbon nanotube film. Adjacent carbon nanotubes are acted upon by van der Waals attractive force to form an entangled structure with micropores defined therein. Sizes of the micropores can be less than 10 micrometers. The porous nature of the flocculated carbon nanotube film will increase the specific surface area of the carbon nanotube layer 110. Further, due to the carbon nanotubes of the carbon nanotube layer 110 being entangled with each other, the carbon nanotube layer 110 employing the flocculated carbon nanotube film has excellent durability, and can be fashioned into desired shapes with a low risk to the integrity of the carbon nanotube layer 110. The flocculated carbon nanotube film, in some embodiments, is free-standing due to the carbon nanotubes being entangled and adhered together by van der Waals attractive force therebetween.

Figure 7:
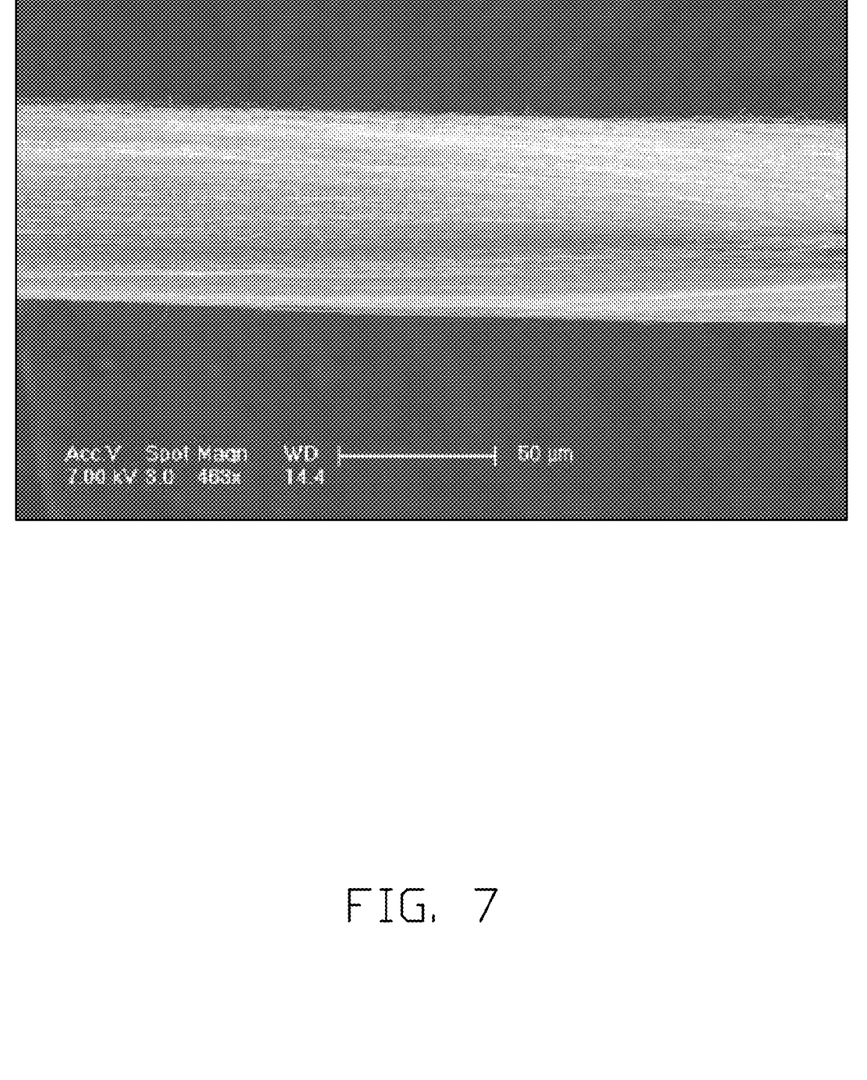
FIG. 7 is an SEM image of one embodiment of an untwisted carbon nanotube wire.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent substantially parallel carbon nanotubes in the drawn carbon nanotube film will bundle together, due to the surface tension of the organic solvent as it volatilizes, and thus, the drawn carbon nanotube film will be shrunk into an untwisted carbon nanotube wire. Referring to FIG. 7, the untwisted carbon nanotube wire includes a plurality of carbon nanotubes substantially oriented along a same direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the untwisted carbon nanotube wire can be arbitrarily set as desired. A diameter of the untwisted carbon nanotube wire ranges from about 0.5 nanometers to about 100 micrometers.

Figure 8:
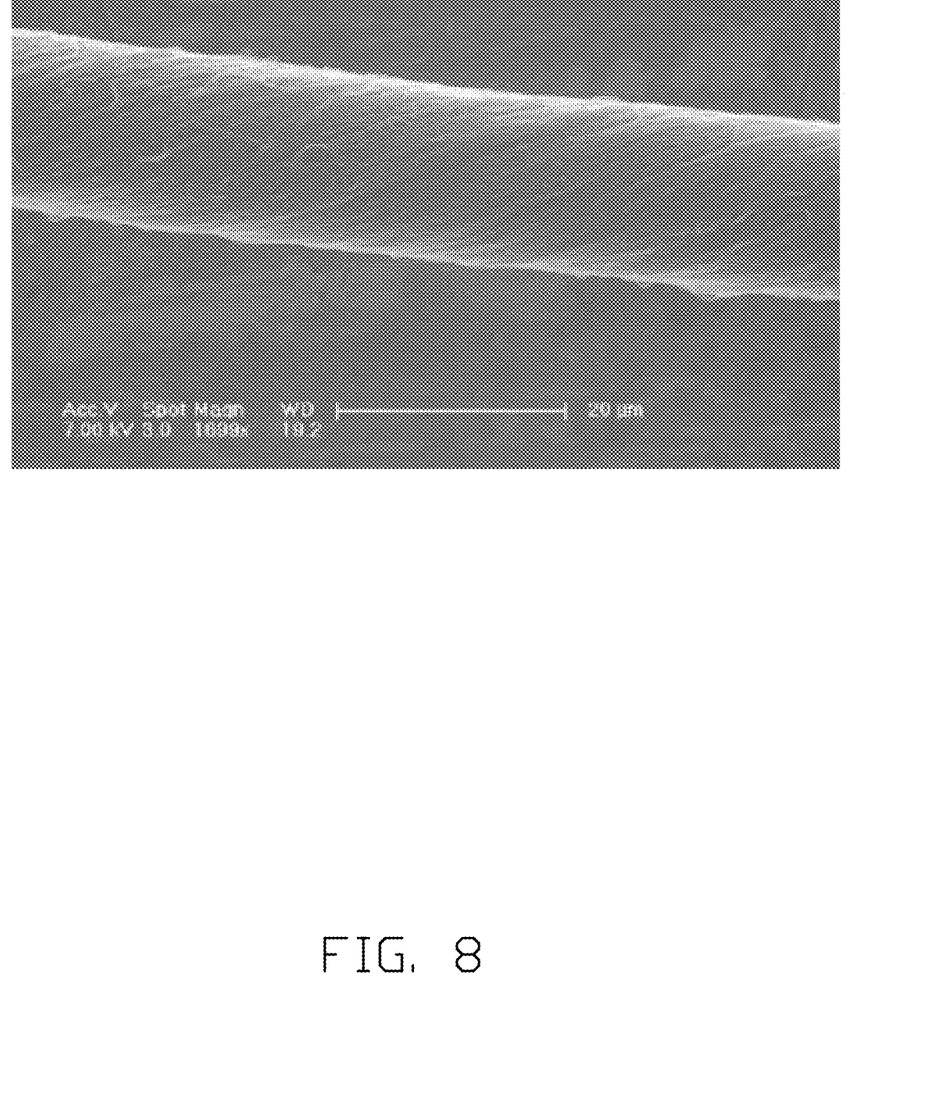
FIG. 8 is an SEM image of one embodiment of a twisted carbon nanotube wire.

The twisted carbon nanotube wire can be formed by twisting a drawn carbon nanotube film using a mechanical force to turn the two ends of the drawn carbon nanotube film in opposite directions. Referring to FIG. 8, the twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The length of the carbon nanotube wire can be set as desired. A diameter of the twisted carbon nanotube wire can be from about 0.5 nanometers to about 100 micrometers. Further, the twisted carbon nanotube wire can be treated with a volatile organic solvent after being twisted to bundle the adjacent substantially paralleled carbon nanotubes together. The specific surface area of the twisted carbon nanotube wire will decrease, while the density and strength of the twisted carbon nanotube wire will increase.

The carbon nanotube layer 110 can be used as a mask for growing the first semiconductor layer 120. The mask is the carbon nanotube layer 110 sheltering a part of the first epitaxial growth surface 101 and exposing another part of the first epitaxial growth surface 101. Thus, the first semiconductor layer 120 can be grown from the exposed first epitaxial growth surface 101. The carbon nanotube layer 110 can form a patterned mask on the first epitaxial growth surface 101 because a plurality of apertures 112 is defined by the carbon nanotube layer 110. Compared to lithography or etching, the method of forming the carbon nanotube layer 110 as the mask is simple, low in cost, and will not contaminate the substrate 100.

It is can be understood that the substrate 100 and the carbon nanotube layer 110 form an epitaxial base to grow the first semiconductor layer 120 thereon.

In step (13), the first semiconductor layer 120 can be grown by a method such as molecular beam epitaxy, chemical beam epitaxy, reduced pressure epitaxy, low temperature epitaxy, select epitaxy, liquid phase deposition epitaxy, metal organic vapor phase epitaxy, ultra-high vacuum chemical vapor deposition, hydride vapor phase epitaxy, or metal organic chemical vapor deposition (MOCVD).

The first semiconductor layer 120 grown on the first epitaxial growth surface 101 by the method of epitaxial growing is single crystal. The material of the first semiconductor layer 120 can be the same as the substrate 100. If the material of the first semiconductor layer 120 is the same as the substrate 100, the first semiconductor layer 120 is called a homogeneous semiconductor epitaxial layer. If the material of the first semiconductor layer 120 is not the same as the substrate 100, the first semiconductor layer 120 is called a heterogeneous semiconductor epitaxial layer. The material of the first semiconductor layer 120 can be Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N. The first semiconductor layer 120 can be an N-type semiconductor layer or a P-type semiconductor layer. The thickness of the first semiconductor layer 120 can be selected according to need. The thickness of the first semiconductor layer 120 can be in a range from about 100 nanometers to about 500 micrometers. For example, the thickness of the first semiconductor layer 120 can be about 200 nanometers, about 500 nanometers, about 1 micrometer, about 2 micrometers, about 5 micrometers, about 10 micrometers, or about 50 micrometers. The first semiconductor layer 120 can be an N-type semiconductor or a P-type semiconductor.

Before growing the first semiconductor layer 120, a buffer layer can be grown on the first epitaxial growth surface (not shown). The material of the buffer layer is selected according to the material of the first semiconductor layer 120. The lattice mismatch between the substrate 100 and the first semiconductor layer 120 can be reduced by the buffer layer and the quality of the first semiconductor layer 120 can be improved.

In one embodiment, the material of the substrate 100 is sapphire and the first semiconductor layer 120 is grown on the substrate 100 by a MOCVD method. The nitrogen source gas is high-purity ammonia ($NH_3$), the Ga source gas is trimethyl gallium (TMGa) or triethyl gallium (TEGa), and the carrier gas is hydrogen ($H_2$). A single drawn carbon nanotube film is placed on the epitaxial growth surface 101 of the substrate 100. The method of growing the first semiconductor layer 120 includes following substeps.

The first step is placing the substrate 100 with the carbon nanotube layer 110 thereon into a reaction chamber and heating the substrate 100 to about 1100° C. to about 1200° C., introducing the carrier gas, and baking the substrate 100 for about 200 seconds to about 1000 seconds;

The second step is growing a GaN buffer layer with the thickness of a range from about 10 nanometers to about 50 nanometers by reducing the temperature to a range from about 500° C. to about 650° C. in the carrier gas atmosphere, and introducing the Ga source gas and the nitrogen source gas at the same time;

Third, stopping the flow of the Ga source gas in the carrier gas and nitrogen source gas atmosphere, increasing the temperature to a range from about 1100° C. to about 1200° C., and maintaining the temperature for about 30 seconds to about 300 seconds; and Fourth, growing the first semiconductor layer 120 by maintaining the temperature of the substrate 100 in a range from about 1000° C. to about 1100° C. and introducing the Ga source gas and the N source gas again.

Figure 9:
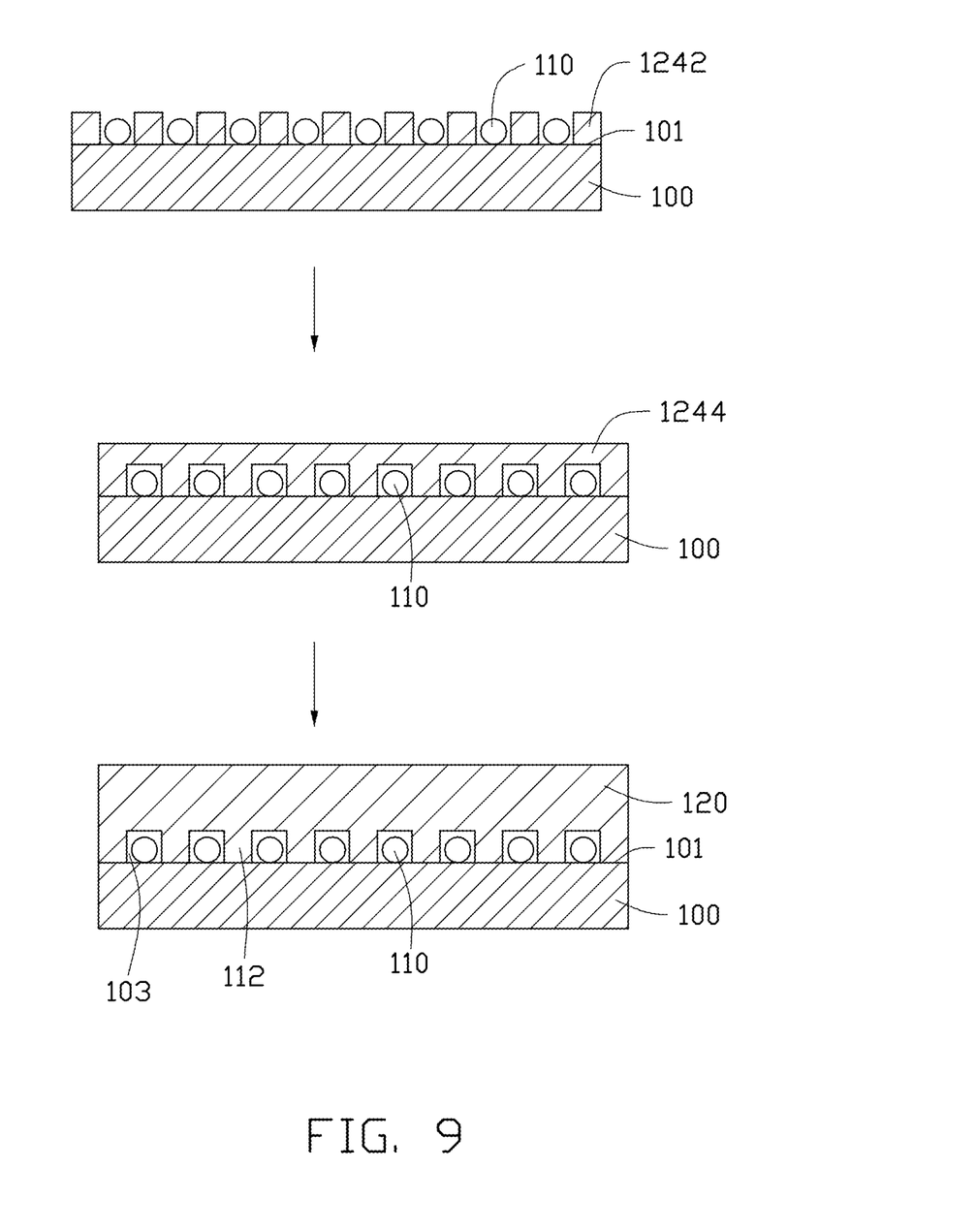
FIG. 9 is a process of growing a first semiconductor layer of the LED fabricated according to the method of FIG. 1.

In detail, the first semiconductor layer 120 is formed by following substeps:

step (131), nucleating on the first epitaxial growth surface 101 and growing a plurality of epitaxial crystal grains 1242 along the direction substantially perpendicular to the first epitaxial growth surface 101;

step (132), forming a continuous epitaxial film 1244 by making the plurality of epitaxial crystal grains 1242 grow along the direction substantially parallel the first epitaxial growth surface 101;

step (133), forming the doped first semiconductor layer 120 by making the epitaxial film 1244 grow along the direction substantially perpendicular to the first epitaxial growth surface 101; and step (134), annealing the doped first semiconductor layer 120.

In step (131), the epitaxial crystal grains grow from the exposed part of the first epitaxial growth surface 101 and through the plurality of apertures 112. The process of the epitaxial crystal grains growing along the direction substantially perpendicular to the first epitaxial growth surface 101 is called vertical epitaxial growth.

In step (132), the epitaxial crystal grains are joined together to form an integral structure (the epitaxial film) to cover the carbon nanotube layer 110. The epitaxial crystal grains are grown and a plurality of grooves 103 is formed to embed the carbon nanotubes of the carbon nanotube layer 110. The plurality of grooves 103 are substantially parallel to each other or intersected with each other. The inner wall of the plurality of grooves 103 can be in contact with the carbon nanotubes or spaced from the carbon nanotubes, depending on whether the material of the epitaxial film and the carbon nanotubes have mutual infiltration. Thus, the epitaxial film is defined as a patterned depression on the surface adjacent to the first epitaxial growth surface 101. The patterned depression is related to the patterned carbon nanotube layer 110. If the carbon nanotube layer 110 includes a layer of substantially parallel and spaced carbon nanotube wires, the patterned depression is a plurality of substantially parallel and spaced grooves. If the carbon nanotube layer 110 includes a plurality of carbon nanotube wires crossed or weaved together to form a carbon nanotube net, the patterned depression is a groove network including a plurality of intersected grooves. The carbon nanotube layer 110 can further prevent lattice dislocation between the epitaxial crystal grains and the substrate 100 from growing. The process of epitaxial crystal grains growing along the direction substantially parallel to the epitaxial growth surface 101 is called lateral epitaxial growth.

In step (133), the first semiconductor layer 120 is obtained by growing for a long duration of time. Because the carbon nanotube layer 110 can prevent the lattice dislocation between the epitaxial crystal grains and the first epitaxial growth surface 101 from growing in step (132), the first semiconductor layer 120 has fewer defects therein.

In step (134), the doped elements of the first semiconductor layer 120 can be activated by annealing at high temperature.

In step (14), the substrate 100 and carbon nanotube layer 110 can be removed by laser irradiation, corrosion, or thermal expansion and contraction. The method of removing the substrate 100 and the carbon nanotube layer 110 depends on the material of the material of the substrate 100 and the material of the first semiconductor layer 120.

In one embodiment, the substrate 100 is sapphire, and the first semiconductor layer 120 is a high-temperature GaN layer. The substrate 100 is removed by laser irradiation and the step (14) includes the following substeps:

step (141), polishing and cleaning the surface of the substrate 100;

step (142), providing a laser beam to irradiate the substrate 100 and the first semiconductor layer 120; and step (143), immersing the substrate 100 and the first semiconductor layer 120 in a solution.

In step (141), the surface of the substrate 100 can be polished by a mechanical polishing or chemical polishing so the substrate 100 has a smooth surface to reduce the scattering in laser irradiation. The surface of the substrate 100 can be cleaned using hydrochloric acid or sulfuric acid to remove the metal impurities and/or oil dirt thereon.

In step (142), the substrate 100 is placed on a flat support in a vacuum or protective gas to prevent the carbon nanotube layer 110 from oxidation. The protective gas can be nitrogen gas, helium gas, argon gas, or other inert gases.

The laser beam irradiates the polished surface of the substrate 100 substantially perpendicular to the polished surface. Thus, the laser beam can irradiate the interface between the substrate 100 and the first semiconductor layer 120. The wavelength of the laser beam can be selected according to the materials of the buffer layer and the substrate 100 so the energy of the laser beam is less than the band-gap energy of the substrate 100 and greater than the band-gap energy of the buffer layer. Thus, the laser beam can get through the substrate 100 to arrive at the buffer layer. The buffer layer can absorb the laser beam and be heated to decompose rapidly. In one embodiment, the buffer layer is a low-temperature GaN layer with a band-gap energy of about 3.3 electron volts, the substrate 100 is sapphire with a band-gap energy of about 9.9 electron volts, and the laser beam has a wavelength of about 248 nanometers, an energy of about 5 electron volts, an impulse duration from about 20 ns to about 40 ns, and an energy density from about 0.4 joules per square centimeter to about 0.6 joules per square centimeter, the shape of the laser spot is square with a side length of about 0.5 millimeters, and the laser spot can move relative to the substrate 100 with a speed of about 0.5 millimeters per second. After absorption of the laser beam, the low-temperature GaN buffer layer can decompose to Ga and $N_2$. The substrate 100 will not be damaged because only a small amount of the laser beam is absorbed.

In step (143), the substrate 100 and the first semiconductor layer 120 are immersed in an acid solution to remove the Ga decomposed from the GaN buffer layer, so the substrate 100 is separated from the first semiconductor layer 120. Furthermore, the carbon nanotube layer 110 which attached on the substrate 100 is removed. The acid solution can be a hydrochloric acid, sulfuric acid, or nitric acid that can dissolve the Ga. Because the buffer layer is decomposed by laser irradiation and removed by immersing in acid solution, the carbon nanotube layer 110 will be removed with the buffer layer. Because the carbon nanotube layer 110 allows the first semiconductor layer 120 and the substrate 100 to have a relative small contacting surface, the substrate 100 can be separated from the first semiconductor layer 120 easily and the damage on the first semiconductor layer 120 will be reduced.

After the substrate 100 and the carbon nanotube layer 110 are removed, the plurality of grooves 103 are exposed from the surface of the first semiconductor layer 120. Thus the surface of the first semiconductor layer 120 forms a patterned surface. The patterned surface is used as the second epitaxial growth surface to grow epitaxial layer.

In step (15), the methods of growing the active layer 130 and the second semiconductor layer 140 are similar with the method of growing the first semiconductor layer 120. The materials of the active layer 130 and the second semiconductor layer 140 are the same as that of the first semiconductor layer 120 to reduce the dislocation defects during the growing process. The thickness of the active layer 130 and the second semiconductor layer 140 is selected according to need.

The active layer 130 is deposited on the first semiconductor layer 120. The thickness of the active layer 130 ranges from about 0.01 micrometers to about 0.6 micrometers. The active layer 130 is a photon excitation layer and can be one of a single layer quantum well film or multilayer quantum well films. The active layer 130 is made of GaInN, AlGaInN, GaSn, AlGaSn, GaInP, or GaInSn. In one embodiment, the active layer 130 has a thickness of about 0.3 micrometers and includes one layer of GaInN and another layer of GaN. The GaInN layer is stacked with the GaN layer. The growth method of the active layer 130 is similar to the first semiconductor layer 120. In one embodiment, the indium source gas is trimethyl indium. The growth of the active layer 130 after the growth of the first semiconductor layer 120 includes the following steps:

(a1) stopping the flow of the Si source gas and maintaining the temperature of the reaction chamber in a range from about 700° C. to about 900° C., and the pressure of the reaction chamber ranges from about 50 torrs to about 500 torrs; and (a2) introducing the indium source gas, and growing an InGaN/GaN multilayer quantum well film to form the active layer 130.

Figure 10:
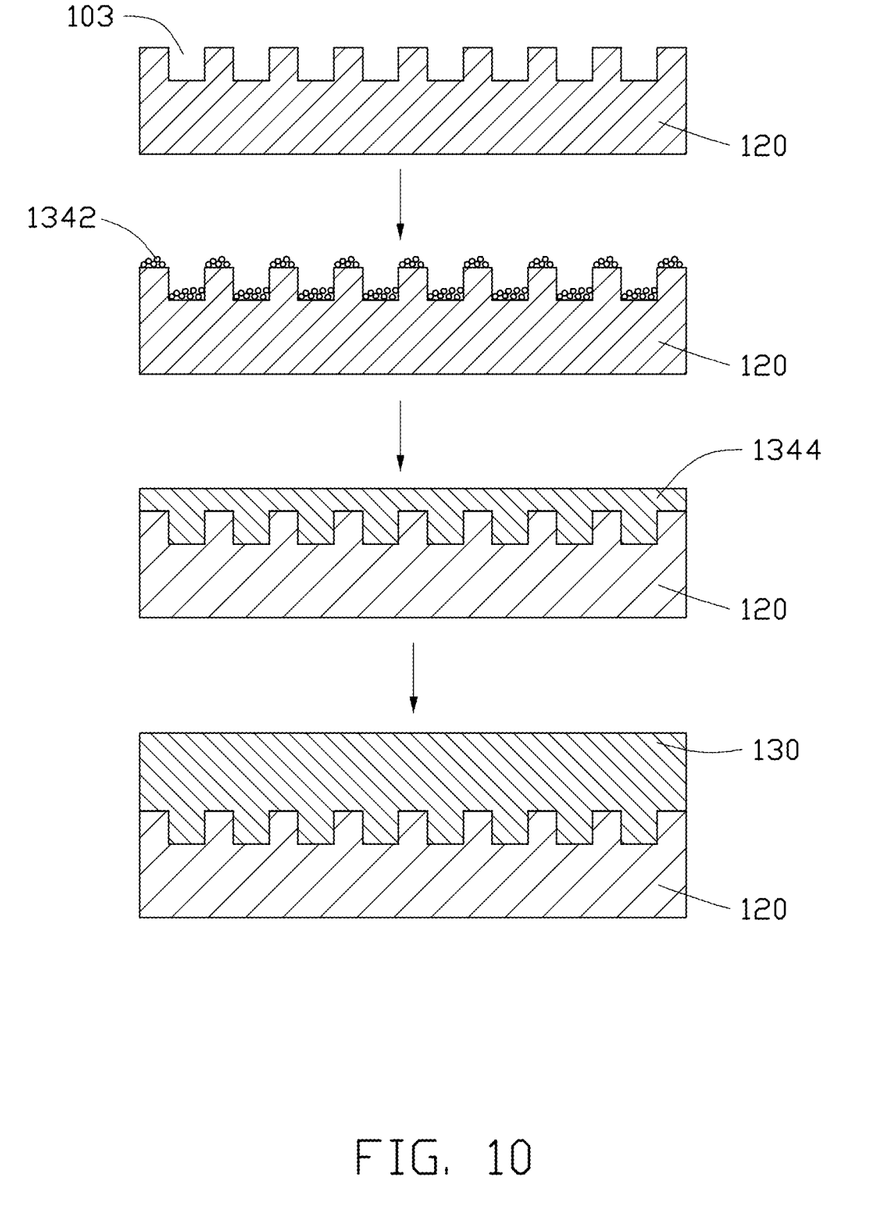
FIG. 10 is a process of growing an active layer of the LED fabricated according to the method of FIG. 1.

Referring to FIG. 10, the active layer 130 is formed by:

step (151), growing a plurality of epitaxial crystal grains 1342 along the direction substantially perpendicular to the patterned surface of the first semiconductor layer 120;

step (152), forming a continuous epitaxial film 1344 by making the plurality of epitaxial crystal grains 1342 grow along the direction substantially parallel to the surface of the first semiconductor layer 120; and step (153), forming the active layer 130 by making the epitaxial film 1344 grow along the direction substantially perpendicular to the surface of the first semiconductor layer 120.

In step (151), the epitaxial crystal grains are grown on the inner wall of the grooves 103 and the surface of the first semiconductor layer 120 between the grooves 103. The growth speed of the epitaxial crystal grains according to the grooves 103 is greater than that of other part surface. Thus the epitaxial grains will be fully filled in the grooves 103 and form a planar surface.

In step (152), the epitaxial crystal grains are joined together to form an integral structure (the epitaxial film 1344) to cover the grooves 103.

In step (153), the active layer 130 is obtained by growing for a long duration of time.

The thickness of the second semiconductor layer 140 ranges from about 0.1 micrometers to about 3 micrometers. The second semiconductor layer 140 can be an N-type semiconductor layer or a P-type semiconductor layer. Furthermore, the type of the second semiconductor layer 140 is different from the type of the first semiconductor layer 120. A surface of the second semiconductor layer 140 is used as an extraction surface of the LED. In one embodiment, the second semiconductor layer 140 is a P-type gallium nitride doped with Mg. The thickness of the second semiconductor layer 140 is about 0.3 micrometers. The growth of the second semiconductor layer 140 is similar to the first semiconductor layer 120. The second semiconductor 140 is grown after the growth of the active layer 130. In one embodiment, the Mg source gas is ferrocene magnesium ($Cp_2Mg$), and the method includes the following steps:

(b1) stopping the flow of the indium source gas and maintaining the temperature of the reaction chamber in a range from about 1000° C. to about 1100° C., and maintaining the pressure of the reaction chamber to a range from about 76 torrs to about 200 torrs; and (b2) growing P-type gallium nitride doped with Mg to form the second semiconductor layer 140 by introducing the Mg source gas.

In step (16), a part of the active layer 130 and the second semiconductor layer 140 is etched via a process of reactive ion etching. The first semiconductor layer 120, the active layer 130 and the second semiconductor layer 140 can form an LED preform. In one embodiment, a part of the active layer 130 and the second semiconductor layer 140 are etched via a process of reactive ion etching, and the process includes:

step (161), coating a layer of photo resist on the top surface of the second semiconductor layer 140;

step (162), removing a portion of the photo resist to expose the second semiconductor layer 140;

step (163), placing the LED preform in an inductively coupled plasma system; and step (164), removing the exposed second semiconductor layer 140 and the active layer 130 and exposing the first semiconductor layer 120 using silicon tetrachloride and chlorine as the etching gas.

In one embodiment, the power of the plasma system is about 50 watts, the input rate of chlorine is about 26 sccm, the input rate of silicon tetrachloride is about 4 sccm, and the air pressure is about 2 Pa, etching about 0.3 micrometers of the second semiconductor layer 140 and about 0.3 micrometers of the active layer 130.

In step (17), the first electrode 150 is located and contacted on a region of the surface of the first semiconductor layer 120. The first electrode 150 can be an N-type electrode or P-type electrode, and the type of the first electrode 150 is the same as the first semiconductor layer 120. The first electrode 150 can be a single layer structure or a multi-layer structure. The material of the first electrode 150 can be selected from titanium (Ti), silver (Ag), aluminum (Al), nickel (Ni), gold (Au), or any combination thereof. The material of the first electrode 150 can also be indium-tin oxide (ITO). The thickness of the first electrode 150 ranges from about 0.01 micrometers to about 2 micrometers. In one embodiment, the first electrode 150 is an N-type electrode and located on one side of the first semiconductor layer 120. The first electrode 150 is a two-layer structure consisting of a Ti layer with a thickness of about and 15 nanometers an Au layer with a thickness of about 100 nanometers.

The second electrode 160 is located and contacted on a region of the surface of the second semiconductor layer 140. The surface of the second semiconductor layer 140 is the extraction surface of the LED. The shape and the location of the second electrode 160 hardly affect the light extraction of the LED. The second electrode 160 can be an N-type electrode or P-type electrode, and the type of the second electrode 160 is the same as the second semiconductor layer 140. The second electrode 160 can be a single layer structure or a multi-layer structure. The material of the second electrode 160 can be selected from titanium (Ti), silver (Ag), aluminum (Al), nickel (Ni), gold (Au), or any combination thereof. The material of the second electrode 160 can also be indium-tin oxide (ITO). The thickness of the second electrode 160 ranges from about 0.01 micrometers to about 2 micrometers. In one embodiment, the second electrode 160 is an N-type electrode and located on one side of the second semiconductor layer 140. The second electrode 160 is a two-layer structure consisting of a Ti layer with a thickness of about and 15 nanometers an Au layer with a thickness of about 100 nanometers.

The first electrode 150 and the second electrode 160 are formed at the same time. The first electrode 150 and the second electrode 160 are prepared via a process of physical vapor deposition (PVD), such as electron beam evaporation, vacuum evaporation, ion sputtering, or physical deposition. In one embodiment, the first electrode 150 and the second electrode 160 prepared via a physical deposition method. The method includes:

step (171), coating a layer of photo resist on the surface of the second semiconductor layer 140 and the exposed surface of the first semiconductor layer 120;

step (172), removing a portion of the photo resist to expose a part of the second semiconductor layer 140 and the first semiconductor layer 120;

step (173), depositing the first electrode 150 on the surface of the first semiconductor layer 120 where the layer of photo resist has been removed, depositing the second electrode 160 on the surface of the second semiconductor layer 140 where the layer of photo resist has been removed; and step (174), removing the residual photo resist via an organic solvent, such as acetone to form the first electrode 150 and the second electrode 160.

The method for making the light emitting diode has many advantages. First, the carbon nanotube layer is a continuous and free-standing structure, and it can be directly placed on the substrate to grow the first semiconductor layer, so the complex sputtering process is avoided. Second, because the apertures of the carbon nanotube layer are very small, the dislocation defects of the first semiconductor layer will be reduced. Third, because carbon nanotubes of the carbon nanotube layer are nanometer scale, the apertures in the carbon nanotube layer can also be nanometer scale, and thus the LED has a high light extraction. The words "nanometer scale" means the diameter of the carbon nanotubes or the size of the apertures is less than 100 nanometers. Lastly, because the surface of the first semiconductor layer can form a patterned surface by the carbon nanotubes of the carbon nanotube layer, and the patterned surface is used as the second semiconductor growth surface, thus the dislocation defects will be further reduced in the process of growing the second semiconductor layer.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making a light emitting diode, the method comprising:

providing a substrate having a first epitaxial growth surface;

placing a carbon nanotube layer on the first epitaxial growth surface of the substrate;

epitaxially growing a first semiconductor layer on the first epitaxial growth surface;

exposing a surface of the first semiconductor layer by removing the substrate and the carbon nanotube layer, wherein the surface of the first semiconductor layer is defined as a second epitaxial growth surface;

growing an active layer and a second semiconductor layer on the second epitaxial growth surface in that order, wherein a surface of the active layer contacting the first semiconductor layer engages with the second epitaxial growth surface;

exposing a part of the first semiconductor layer by etching a part of the active layer and the second semiconductor layer; and applying a first electrode on the first semiconductor layer and applying a second electrode on the second semiconductor layer.

2. The method of claim 1, wherein the carbon nanotube layer is free-standing and placed on the first epitaxial growth surface directly.

3. The method of claim 1, wherein the carbon nanotube layer is treated with an organic solvent after being placed on the first epitaxial growth surface.

4. The method of claim 2, wherein the carbon nanotube layer is maintained to be successive and continuous while the first semiconductor layer is grown on the first epitaxial growth surface epitaxially.

5. The method of claim 2, wherein the carbon nanotube layer comprises a plurality of carbon nanotubes arranged along a direction substantially parallel to the first epitaxial growth surface.

6. The method of claim 2, wherein a plurality of apertures is defined by the carbon nanotube layer, a part of the first epitaxial growth surface is exposed from the plurality of apertures, and the first semiconductor layer is grown through the plurality of apertures.

7. The method of claim 1, wherein the carbon nanotube layer is formed by attaching a carbon nanotube film or a plurality of carbon nanotube wires on the first epitaxial growth surface directly.

8. The method of claim 1, wherein a plurality of grooves is defined by the first semiconductor layer, and carbon nanotubes of the carbon nanotube layer are embedded in the plurality of grooves.

9. The method of claim 8, wherein the plurality of grooves are substantially parallel to each other or intersected with each other.

10. The method of claim 9, wherein the active layer is formed by:

growing a plurality of epitaxial crystal grains along the direction substantially perpendicular to the second epitaxial growth surface of the first semiconductor layer;

forming a continuous epitaxial film by making the plurality of epitaxial crystal grains grow along the direction substantially parallel to the second epitaxial growth surface of the first semiconductor layer; and forming the active layer by making the epitaxial film grow along the direction substantially perpendicular to the second epitaxial growth surface of the first semiconductor layer.

11. The method of claim 1, wherein a buffer layer is grown on the first epitaxial growth surface before growing the first semiconductor layer.

12. The method of claim 11, wherein a thickness of the carbon nanotube layer is greater than a thickness of the buffer layer.

13. The method of claim 11, wherein after epitaxially growing the first semiconductor layer, a laser beam is provided to irradiate the substrate in a vacuum or protective gas and the buffer layer absorbs the laser beam and is heated to decompose rapidly.

14. The method of claim 13, wherein the laser beam has a wavelength of about 248 nanometers, an energy of about 5 electron volts, an impulse duration from about 20 ns to about 40 ns, and an energy density from about 0.4 joules per square centimeter to about 0.6 joules per square centimeter, a shape of a laser spot of the laser beam is square with a side length of about 0.5 millimeters, and the laser spot moves relative to the substrate with a speed of about 0.5 millimeters per second.

15. A method for making a light emitting diode, the method comprising:

providing a substrate having a first epitaxial growth surface;

placing a carbon nanotube layer on the first epitaxial growth surface of the substrate;

epitaxially growing a GaN buffer layer on the first epitaxial growth surface of the substrate;

epitaxially growing an N-type GaN layer on the GaN buffer layer;

exposing a surface of the N-type GaN layer by removing the substrate, the GaN buffer layer, and the carbon nanotube layer, wherein the surface of the N-type GaN layer is defined as a second epitaxial growth surface;

growing an InGaN/GaN layer and a P-type GaN layer on the second epitaxial growth surface in that order; and applying a first electrode on the N-type GaN layer and applying a second electrode on the P-type GaN layer.

* * * * *

UNITED STATES PATENT AND TRADEMARK OFFICE
CERTIFICATE OF CORRECTION

PATENT NO. : 8,759,130 B2  
APPLICATION NO. : 13/729268  
DATED : June 24, 2014  
INVENTOR(S) : Yang Wei and Shou-Shan Fan Page 1 of 1

It is certified that error appears in the above-identified patent and that said Letters Patent is hereby corrected as shown below:

Please add Item (30) regarding "Foreign Application Priority Data" on the title page of the Patent with the following:

(30) Foreign Application Priority Data

Mar. 28, 2012 (CN) .................. 2012 10085255.3

Signed and Sealed this
Twenty-sixth Day of July, 2016

Michelle K. Lee
*Director of the United States Patent and Trademark Office*